(12) United States Patent
Reese

(10) Patent No.: US 7,602,850 B2
(45) Date of Patent: Oct. 13, 2009

(54) CONTENT ADAPTIVE VARIABLE LENGTH CODING (CAVLC) DECODING

(75) Inventor: Robert J. Reese, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 1039 days.

(21) Appl. No.: 10/741,233

(22) Filed: Dec. 19, 2003

(65) Prior Publication Data

US 2005/0135691 A1 Jun. 23, 2005

(51) Int. Cl.
*H04N 7/12* (2006.01)
*G06K 9/36* (2006.01)

(52) U.S. Cl. .................................. 375/240.23; 382/246
(58) Field of Classification Search ................ 348/403, 348/14.3, 469, 404, 406, 407, 419; 382/246, 382/233, 239, 238, 232, 236; 341/51, 50, 341/67, 106, 143, 60, 63; 375/240.01, 240.12, 375/240.29

See application file for complete search history.

(56) References Cited

U.S. PATENT DOCUMENTS

| | | | |
|---|---|---|---|
| 6,188,797 B1 * | 2/2001 | Moledina et al. | 382/246 |
| 6,546,053 B1 * | 4/2003 | Ishii | 375/240.27 |
| 6,646,578 B1 * | 11/2003 | Au | 341/67 |
| 6,829,299 B1 * | 12/2004 | Chujoh et al. | 375/240 |
| 7,099,387 B2 * | 8/2006 | Bjontegaard et al. | 375/240 |
| 2001/0033697 A1 * | 10/2001 | Shimada | 382/246 |
| 2002/0114398 A1 * | 8/2002 | Lin et al. | 375/253 |
| 2003/0053700 A1 * | 3/2003 | Ishii | 382/233 |
| 2003/0202601 A1 * | 10/2003 | Bjontegaard et al. | 375/240.22 |

* cited by examiner

*Primary Examiner*—Behrooz Senfi
(74) *Attorney, Agent, or Firm*—Blakely, Sokoloff, Taylor & Zafman LLP

(57) ABSTRACT

A method and apparatus for decoding a bitstream. The method may include generating an indication of a number of coefficients and a number of trailing ones in a portion of a bitstream using either a first lookup table (LUT) indexed by a number of leading zeros to return a number of remaining bits in a code and a second LUT indexed by both the number of leading zeros and the remaining code bits to return the number of coefficients and the number of trailing ones or bit parsing processing when the leading zeros value equals a predetermined value, generating an indication of a number of total zeros, including using either a third LUT indexed by the number of coefficients and bits of the bitstream when the number of coefficients is in a first range or bit level processing when the number of coefficients is outside the first range, generating an indication of one or more run before values using either a fourth LUT indexed by the number of coefficients and bits of the bitstream when a zeros left value is in a second range or bit parsing processing when the zeros left is not in the second range, and generating coefficients in block positions in response to the generation of the trailing ones value, the number of coefficients value, the total zeros value and run before values.

22 Claims, 7 Drawing Sheets

1

CONTENT ADAPTIVE VARIABLE LENGTH CODING (CAVLC) DECODING

FIELD OF THE INVENTION

The present invention is related to the field of compression and decompression; more particularly, the present invention is related to video content adaptive variable length coding (CAVLC).

BACKGROUND

Video coding is used in a wide range of multimedia applications including digital television, videoconferencing, mobile video and video streaming. Video coding has developed with a number of international standards. A number of these international standards include the use of variable length codes (VLCs). For example, in the international standard jointly published by the ITU-T as Recommendation H.263+, a variable length code (VLC) decoding is included.

In the prior art, some variable length code (VLC) decoding implementations use lookup tables (LUTs). For example, a H.263+decoder of Intel Corporation of Santa Clara, Calif., used LUTs to decode VLC codes. However, this decoder only used the LUTs to decode coefficients and zero run information. These LUTs were readily generated from the tables in the H.263+standard's specification. The current draft of the H.264/MPEG-4 Part 10 specification includes a decoding process in which VLC codes are used. See "Draft Errata List with Revision-Marked Corrections for H.264/AVC, the approved JVT output document from the Sep. 2-5, 2003 meeting, JVT-I050.doc. In common with earlier video coding standards, H.264 does not specify how to compress ("encode") video and, instead, specifies the syntax of a bitstream containing coded video data and a method of decoding the data.

During entropy coding with an H.264 video encoder, quantized transform coefficients and side information (including motion vectors, prediction mode choices and headers) are entropy coded using variable-length codes or arithmetic coding. If variable-length coding is used, quantized transform coefficients are coded using a context-adaptive variable length coding (CAVLC) and other syntax elements are coded with "universal" variable length codes.

CAVLC exploits the coefficients' statistical correlation by first scanning them in a zigzag manner into a one-dimensional array. Every non-zero coefficient is then associated with a variable run that counts the number of zero coefficients to the previous non-zero coefficient.

Often 1 bits with a sign are among the highest-frequency coefficients. These are counted and coded with the total number of non-zero coefficients using one rule from a set of code tables. The decision of which table to use is made based on the number of non-zero coefficients in neighboring blocks. Additionally, the sign of the 1 bits has to be indicated to the decoder. The values of the remaining coefficients are then coded using adaptive Rice codes. Thus, several code tables are used, and the choice among the tables is made according to the value of the previously encoded coefficient. Thereafter, the sum of the runs is computed and encoded with one out of 15 tables depending upon the number of non-zero coefficients in that block. At this point, the only remaining operation is to code the individual run values with one out of seven code tables, depending upon the remaining sum of the runs. All code tables used by CAVLC are generated empirically.

To summarize, CAVLC encoding of a block of transform coefficients proceeds as follows. First, the number of coefficients and trailing ones (T1s) are encoded. Second, the sign of each T1 is encoded. Next, the levels of the remaining non-zero coefficients are encoded. Then, the total number of zeros occurring before the last coefficient is encoded. Lastly, each run of zeros is encoded.

An H.264 reference software implementation is currently available. The software implementation uses pattern-matching to obtain the number of coefficients and the number of trailing ones. In this software implementation, pattern matching is used between the codes in an encoder lookup table (LUT) and the bits at the head of the bitstream. Other implementations use LUTs to obtain the number of coefficients and the number of trailing ones. However, because of the size of the tables is large in order to accommodate all of the possible inputs, the use of these tables is not efficient and is slow. Similarly, LUTs are used in prior art implementations to obtain the number of total zeros, and have the same limitations as those implementations to obtain the number of coefficients and the number of trailing ones.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
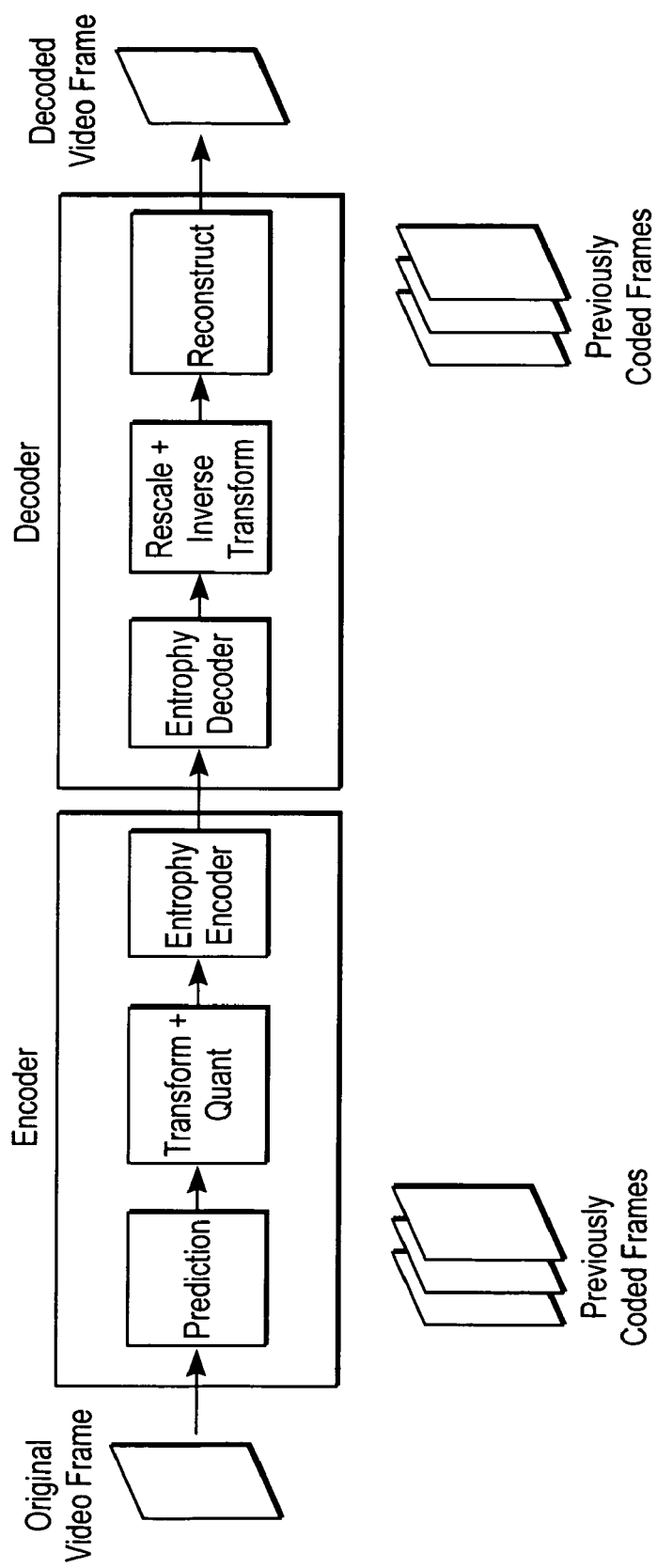
FIG. 1A is a block diagram of an H.264 video encoder and decoder (CODEC).

A method and apparatus for efficiently decoding codes of a variable-length code (VLC) bitstream is described. In one embodiment, the bitstream contains quantized coefficient level and block position information (e.g., an H.264 bitstream). In one embodiment, the VLC code decoding process uses small-memory-footprint lookup tables (LUTs) combined with bit-level processing to achieve a level of performance beyond that obtained using prior art techniques, including performing decoding of VLC codes efficiently in a reduced, and potentially minimized, number of central processing unit (CPU) cycles.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory.

These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), erasable programmable ROMs (EPROMs), electrically erasable programmable ROMs (EEPROMs), magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

One encoder embodiment uses content adaptive variable length coding (CAVLC) to code quantized coefficients for each 4×4 block of each 16×16 macroblock (MB) in an H.264 video bitstream. The use of CAVLC takes advantage of the presence of a large number of coefficients that quantize to zero and the order of the remaining nonzero coefficients. For each 4×4 block, the following VLC-coded data may be present: the number of coefficients and a number of trailing ones, n signed coefficient levels, a number of total zeros between coefficients (excludes trailing zeros), and m run before values (block position information). Each of these has a separate set of VLC codes defined for the encoder.

FIG. 1A is a block diagram of the basic structure of an H.264 video encoder and decoder (CODEC). The processing blocks included operate together to create a bitstream of data compliant with the H.264 standard and to decode such a bitstream as set forth in the H.264 standard. Referring to FIG. 1A, an original video frame 101 is processed in units of a macroblock. Each macroblock corresponds to a 16×16 pixel region of the displayed frame. Prediction block 102 forms a prediction for each macroblock (or part of a macroblock) based on data that has been previously coded in the same frame ("intra" prediction) or other video frames ("inter" prediction using motion estimation and compensation) and this prediction is subtracted from the current macroblock. Transform and quantization block 103 transforms the residual data produced by this subtraction into the spatial frequency domain and quantizes the transformed data to remove less-significant information. Entropy encoder 103 compresses the quantized values with header data to form a coded bitstream. In the decoder, the same process occurs in the reverse order. That is, entropy decoder 104 decompresses the bitstream, rescaling the values (using inverse quantization) and performs an inverse transform on the rescaled values; reconstruction block 106 forms a prediction and adds the prediction to the decoded residual to produce a decoded video frame.

Figure 1B:
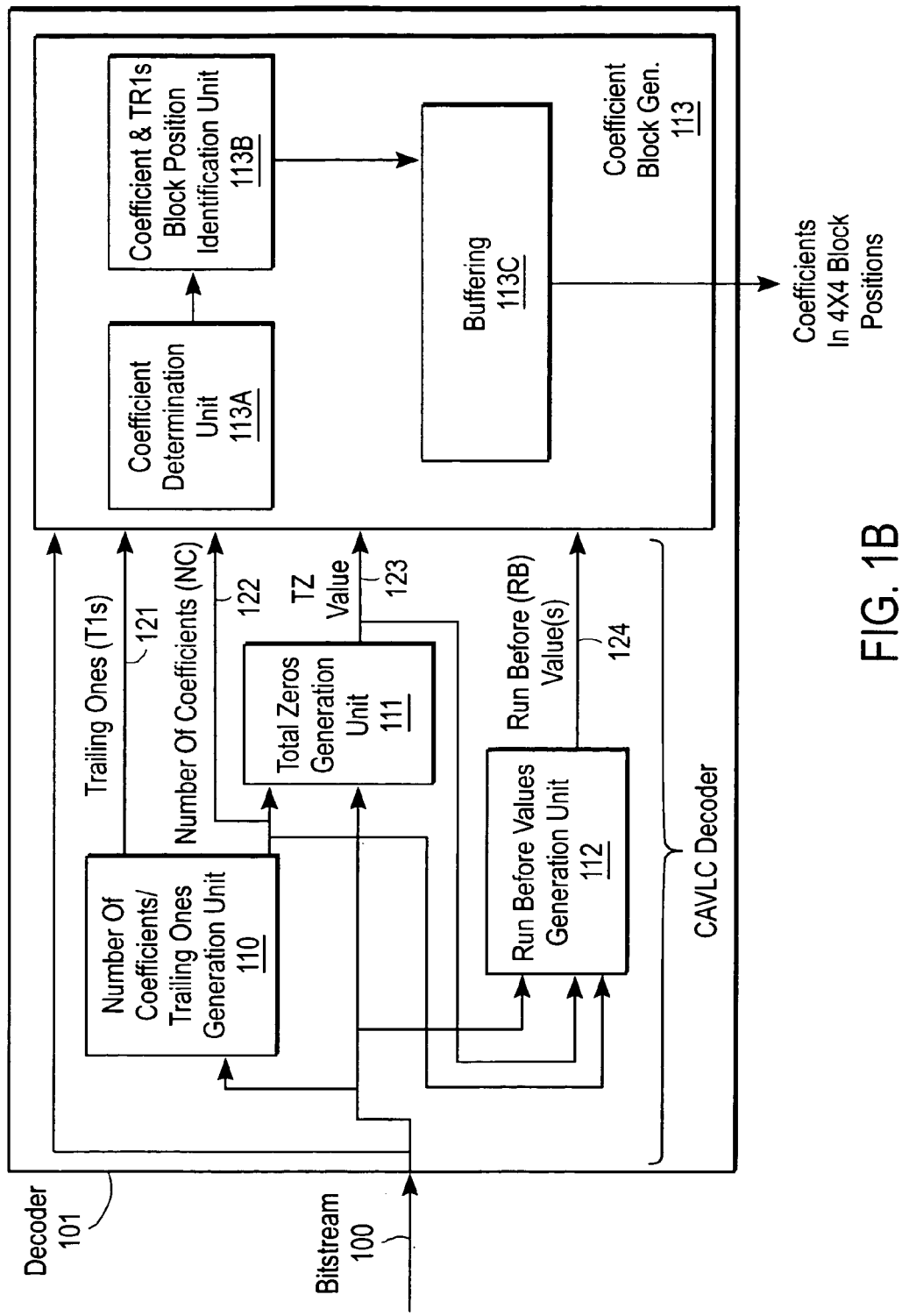
FIG. 1B is one embodiment of a VLC decoder.

FIG. 1B is one embodiment of a VLC decoder, such as the entropy decoder that appears in FIG. 1A. The VLC decoder comprises processing logic that may comprise hardware (e.g., circuitry, dedicated logic, etc.), software (such as is run on a general purpose computer system or a dedicated machine), or a combination of both.

Referring to FIG. 1B, decoder 101 decodes a bitstream 100 using a number of coefficients and trailing ones (T1s) generation unit 110, a total zeros generation unit 111, a run before values generation unit 112, and coefficient block generator 113. The number of coefficients and trailing ones (T1s) generation unit 110, the total zeros generation unit 111, and the run before values generation unit 112 form a CAVLC decoder.

The number of coefficients and T1s generation unit 110 receives bitstream 100 and generates trailing ones (TR1s) value 121 and a number of coefficients (NC) value 122 in response thereto. In one embodiment, the number of coefficients and T1s generation unit 110 comprises a small inverse lookup table that outputs the number of coefficients and T1s developed from analysis of the encoder VLC codes and some processing logic for handling one or more outlier cases not handled by the lookup table.

The total zeros generation unit 111 receives the NC value 122 and bitstream 100 and generates a number of total zeros (TZ) value 123 in response thereto. In one embodiment, the total zeros generation unit 111 uses a combination of a small lookup table and bit-level processing to decode the number of total zeros from the bitstream.

The run before values generation unit 112 receives bitstream 100, NC value 122, and TZ value 123 and generates run before (RB) values 124 in response thereto. In one embodiment, the run before values generation unit 112 comprises a small lookup table and bit-level processing to decode run before values.

Coefficient block generator 113 receives bitstream 100, T1s value 121, NC value 122, TZs value 123, and RB values 124 and generates coefficients in 4×4 block positions. In one embodiment, the generation of coefficients and trailing ones in 4×4 block positions is done in accordance with the H.264 Standard. Coefficient determination unit 113A determines coefficients from the bitstream, and coefficient and T1s block position identification unit 113B determines the block positions for the coefficients, including the level-1 coefficients resulting from the T1s. In one embodiment, the operations of both of these units are in accordance with the H.264 Standard. The coefficients along with the block position information, is stored in buffering 113C. In one embodiment, decoder 101 decodes all of the CAVLC codes for a 4×4 block from the bitstream at once, storing the multiple coefficients and run before values in buffers.

Embodiments of the present invention reduce the lookup table memory requirements, which is especially beneficial for processors that lack a secondary cache because usage of the primary cache has a large effect upon overall performance.

Number of Coefficients and Trailing Ones

In one embodiment, a single VLC is used to code the number of coefficients and the number of T1s. In one encoder embodiment, the number of coefficients and the number of T1s are encoded using a code read from an LUT indexed by those two values plus an input value N (selecting one of 4 subtables given below) calculated from the number of coefficients in surrounding blocks. In one decoder embodiment, because most of the codes begin with a string of zero bits whose length determines total code length and how to extract number of coefficients and trailing ones from the remainder of the code, two lookup tables are used, both being a set of 4 tables corresponding to the value of N. The first table, indexed by the number of leading zeros, returns the number of remaining bits in the code. The second table, indexed by both the number of leading zeros and the remaining code bits, returns the number of coefficients and the number of trailing ones. Exemplary tables are given below.

In one decoder embodiment, to compensate for a few codes that have no leading zeros and for a few codes for which the number of remaining bits cannot be determined from the number of leading zeros, the decoder includes additional processing. In one embodiment, a code having no leading zeros is handled by 4 bit-parsing code fragments, one for each value of N, where N is generated in accordance with the H.264 Standard. The bit parsing code fragments are small and fast because they are only needed for a very few cases. To compensate for codes for which the number of remaining bits cannot be determined from the number of leading zeros, a unique value is returned from the second table lookup and signals the performance of another lookup in a third table containing the values for these few special cases. This is the auxiliary LUT given below.

Figure 2A:
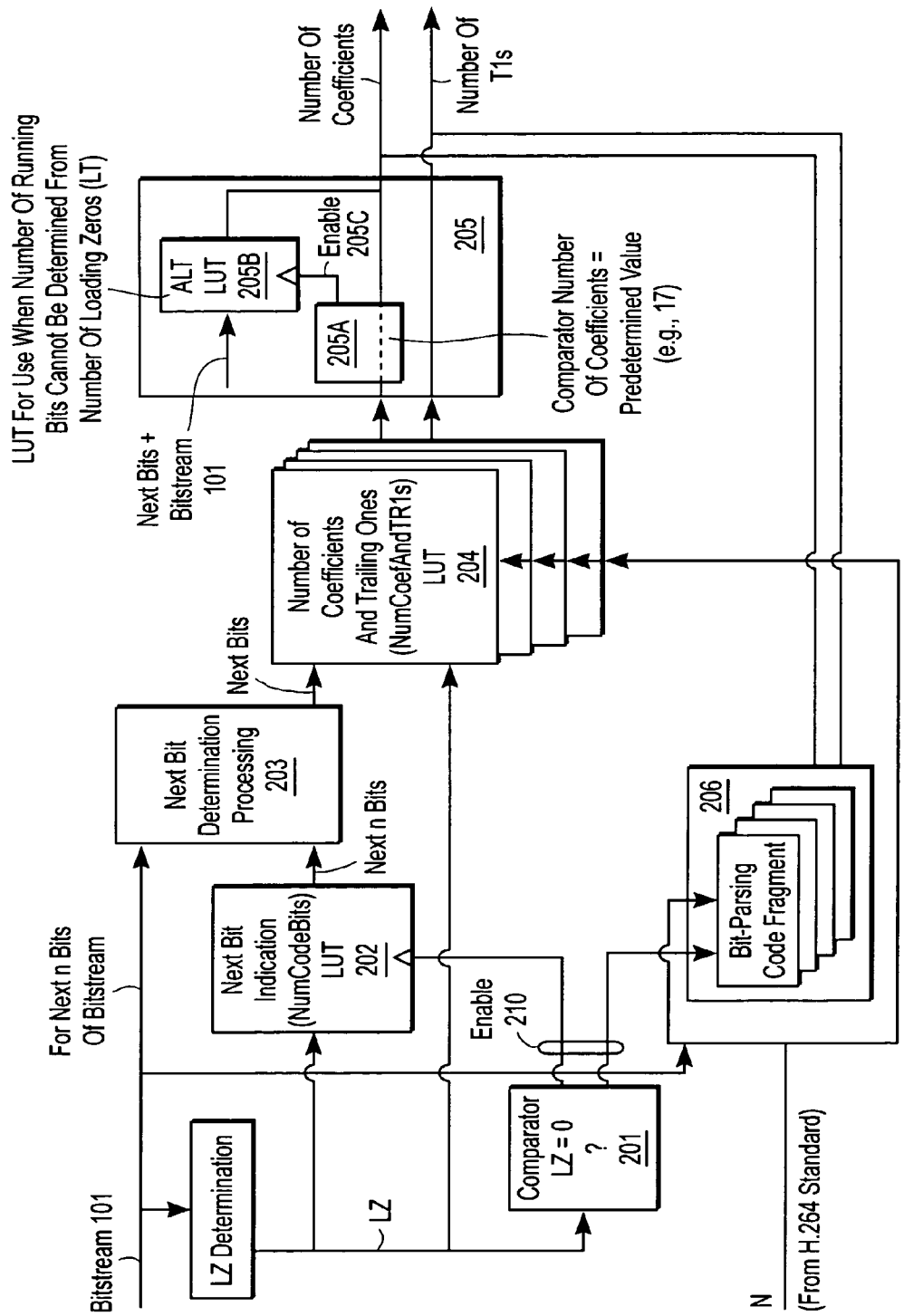
FIG. 2A is a flow diagram of one embodiment of the process for generating the number of coefficients and the number of trailing ones.

FIG. 2A is a flow diagram of one embodiment of the process for generating the number of coefficients and the number of trailing ones. The process is performed by processing logic that may comprise hardware (e.g., circuitry, dedicated logic, etc.), software (such as is run on a general purpose computer system or a dedicated machine), or a combination of both.

Referring to FIG. 2A, comparison unit 201 receives LZ value 130 and compares whether LZ value 130 is equal to zero. If it is not, comparison unit 201 enables next bit indication LUT 202 and disables bit parsing code fragment processing 206 using enable output 210. If it is, comparison unit 201 enables bit parsing code fragment processing 206 and disables next bit indication LUT 202 using enable output 210.

Next bit indication LUT 202 receives LZ value 202 and, using LZ value 202 as an index, outputs an indication of which of the next bits n in bitstream 101 are to be examined. In one embodiment, next bit indication LUT 202 comprises the Number of Code Bits (NumCodeBits) table given below.

Using the next bit indication n from next bit indication LUT 202 as well as the next n bits of bitstream 101, next bit determination processing logic determines the values of the next n bits in bitstream 101 and outputs them. The number of coefficients and trailing is LUT 204 receives the next bits of bitstream 101 output by next bit determination processing logic 203 and LZ value 130 as an index into one of a set of tables (e.g., 4 tables) selected by N. The value N and its generation are set forth in the H.264 Standard. In response to the inputs, the number of coefficients and trailing 1s LUT 204 outputs a value indicative of the number of coefficients (NC) and a value indicative of the number of T1s. In one embodiment, the number of coefficients and trailing 1s LUT 204 comprises the Number of Coefficients and Trailing Ones (NumCoefAndTR1s) table given below.

Thereafter, output unit 205 receives the values indicative of the number of coefficients and the number of trailing zeros and using comparison unit 205A tests whether the number of coefficients is represented with a predetermined value (e.g., 17). If not, then the values of the number of coefficients and the number of trailing ones are output from output unit 205. If so, then comparison unit 205A enables alternative LUT 205B via enable 205C and the next bits plus one more bit of bitstream 100 are used as an index into alternative LUT 209, which generates the NC and T1s that are output from output unit 205.

Figure 2B:
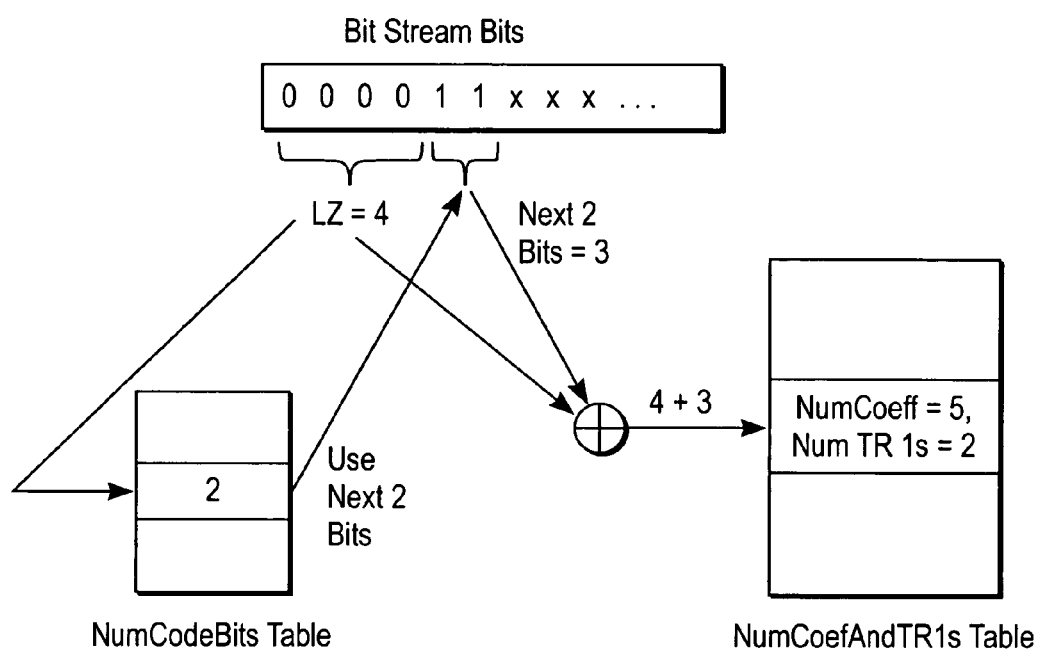
FIG. 2B illustrates an example of the use of the two lookup tables to generate the number of coefficients and the number of trailing ones.

FIG. 2B illustrates an example of the use of the two lookup tables, NumCodeBits table 202 and NumCoefAndTR1s table 207. Referring to FIG. 2B, the bitstream includes 4 leading zero bits. Therefore, LZ equals 4. Using the LZ value, the NumCodeBits table is indexed and the number in the NumCodeBits table corresponding to an LZ value of 4 is the number 2. This means that the next two bits in the bitstream after the four leading zeros are accessed. In this case, the next 2 bits are both 1, which equals 3. The LZ value, 4, and the number 3 are used to access a location in the NumCoefAndTR1s table. Specifically, the LZ value specifies a section of the table, and the number 3 is the offset from the start of the section of the table corresponding to an LZ value of 4. Accessing the NumCoefAndTR1s table using an LZ value of 4 and the next two bits being a value of 3, the final table lookup returns a number of coefficients (NumCoeff) of 5 and a number of trailing ones (TR1s) of 2. Note that this is an example only and the preferred lookup tables are given below.

Referring back to FIG. 2A, if comparison unit 201 indicates that there are no leading zeros and enables bit-parsing code fragment processing, then one of 4 bit parsing code fragments is selected based on the value of N (generated in accordance with the H.264 Standard). Each bit-parsing code fragments processing bits in bitstream 101 one at a time to determine the number of coefficients and the trailing 1s. The VLC values for all possible NC/T1 combinations are defined in the H.264 standard.

EXEMPLARY LOOKUP TABLES FOR THE NUMBER OF COEFFICIENTS AND TRAILING ONES

In one embodiment, a lookup number of NumCoeff codeword bits to read is performed based upon the number of leading zeros. Four tables: Num-VLC 0, VLC 1, VLC 2, and VLC ChromaDC, are used.

```
const U8 NumNumCoeffCodeBits[4][16] =
{
    {0,0,0,1,1,2,2,2,2,3,3,3,3,2,0},
    {0,1,2,2,2,2,2,3,3,3,2,2,0},
    {0,3,3,3,3,3,2,2,1,0},
    {0,0,0,2,1,1,1}
};
```

A lookup of NumCoeff and TROnes using codeword following leading zeros is performed indexed by [VLCIndex][NumLeadingZeros−1][codeword].

```
typedef struct {
    I8 NumCoeff;
    I8 TROnes;
} struct_NumCoeffAndTROnes;
```

In one embodiment, an entry of 17 for NumCoeff in the following tables signals an invalid code and the need to read an additional bit. These are a few cases in the VLC-NUM tables where the number of leading zeros matches codewords of different lengths (all varying only by one bit).

For those cases, the above table, NumNumCoeffCodeBits, has the shorter code length; the fewer bits of the longer codewords match the "17 signal" entries.

```
const struct_NumCoeffAndTROnes NumCoeffAndTROnes [4][16][8] =
{
    // VLC 0
    {
                                                                              // Leading zeros
        {{1,1},{-1,-1},{-1,-1},{-1,-1},{-1,-1},{-1,-1},{-1,-1},{-1,-1}},      // 1
        {{2,2},{-1,-1},{-1,-1},{-1,-1},{-1,-1},{-1,-1},{-1,-1},{-1,-1}},      // 2
        {{17,-1},{3,3},{-1,-1},{-1,-1},{2,1},{1,0},{-1,-1},{-1,-1}},          // 3
        {{17,-1},{4,3},{-1,-1},{-1,-1},{5,3},{3,2},{-1,-1},{-1,-1}},          // 4
        {{6,3},{4,2},{3,1},{2,0},{-1,-1},{-1,-1},{-1,-1},{-1,-1}},            // 5
        {{7,3},{5,2},{4,1},{3,0},{-1,-1},{-1,-1},{-1,-1},{-1,-1}},            // 6
        {{8,3},{6,2},{5,1},{4,0},{-1,-1},{-1,-1},{-1,-1},{-1,-1}},            // 7
        {{9,3},{7,2},{6,1},{5,0},{-1,-1},{-1,-1},{-1,-1},{-1,-1}},            // 8
        {{8,0},{9,2},{8,1},{7,0},{10,3},{8,2},{7,1},{6,0}},                   // 9
        {{12,3},{11,2},{10,1},{10,0},{11,3},{10,2},{9,1},{9,0}},              // 10
        {{14,3},{13,2},{12,1},{12,0},{13,3},{12,2},{11,1},{11,0}},            // 11
        {{16,3},{15,2},{15,1},{14,0},{15,3},{14,2},{14,1},{13,0}},            // 12
        {{16,0},{16,2},{16,1},{15,0},{-1,-1},{-1,-1},{-1,-1},{-1,-1}},        // 13
        {{13,1},{-1,-1},{-1,-1},{-1,-1},{-1,-1},{-1,-1},{-1,-1},{-1,-1}}      // 14
    },
    // VLC 1
    {
                                                                              // Leading zeros
        {{17,-1},{2,2},{-1,-1},{-1,-1},{4,3},{3,3},{-1,-1},{-1,-1}},          // 1
        {{17,-1},{17,-1},{5,3},{2,1},{6,3},{3,2},{3,1},{1,0}},                // 2
        {{7,3},{4,2},{4,1},{2,0},{-1,-1},{-1,-1},{-1,-1},{-1,-1}},            // 3
        {{8,3},{5,2},{5,1},{3,0},{-1,-1},{-1,-1},{-1,-1},{-1,-1}},            // 4
        {{5,0},{6,2},{6,1},{4,0},{-1,-1},{-1,-1},{-1,-1},{-1,-1}},            // 5
        {{9,3},{7,2},{7,1},{6,0},{-1,-1},{-1,-1},{-1,-1},{-1,-1}},            // 6
        {{11,3},{9,2},{9,1},{8,0},{10,3},{8,2},{8,1},{7,0}},                  // 7
        {{11,0},{11,2},{11,1},{10,0},{12,3},{10,2},{10,1},{9,0}},             // 8
        {{14,3},{13,2},{13,1},{13,0},{13,3},{12,2},{12,1},{12,0}},            // 9
        {{17,-1},{17,-1},{14,2},{14,0},{15,0},{15,2},{14,1}},                 // 10
        {{16,3},{16,2},{16,1},{16,0},{-1,-1},{-1,-1},{-1,-1},{-1,-1}},        // 11
        {{15,3},{-1,-1},{-1,-1},{-1,-1},{-1,-1},{-1,-1},{-1,-1},{-1,-1}}      // 12
    },
    // VLC 2
    {
                                                                              // Leading zeros
        {{5,1},{5,2},{4,1},{4,2},{3,1},{8,3},{3,2},{2,1}},                    // 1
        {{3,0},{7,2},{7,1},{2,0},{9,3},{6,2},{6,1},{1,0}},                    // 2
        {{7,0},{6,0},{9,2},{5,0},{10,3},{8,2},{8,1},{4,0}},                   // 3
        {{12,3},{11,2},{10,1},{9,0},{11,3},{10,2},{9,1},{8,0}},               // 4
        {{12,0},{13,2},{12,1},{11,0},{13,3},{12,2},{11,1},{10,0}},            // 5
        {{17,-1},{17,-1},{17,-1},{13,1},{-1,-1},{-1,-1},{-1,-1},{-1,-1}},     // 6
        {{16,1},{15,0},{15,3},{15,2},{-1,-1},{-1,-1},{-1,-1},{-1,-1}},        // 7
        {{16,3},{16,2},{-1,-1},{-1,-1},{-1,-1},{-1,-1},{-1,-1},{-1,-1}},      // 8
        {{16,0},{-1,-1},{-1,-1},{-1,-1},{-1,-1},{-1,-1},{-1,-1},{-1,-1}}      // 9
    },
    // VLC DC Chroma
    {
                                                                              // Leading zeros
        {{0,0},{-1,-1},{-1,-1},{-1,-1},{-1,-1},{-1,-1},{-1,-1},{-1,-1}},      // 1
        {{2,2},{-1,-1},{-1,-1},{-1,-1},{-1,-1},{-1,-1},{-1,-1},{-1,-1}},      // 2
        {{2,0},{3,3},{2,1},{1,0},{-1,-1},{-1,-1},{-1,-1},{-1,-1}},            // 3
        {{4,0},{3,0},{-1,-1},{-1,-1},{-1,-1},{-1,-1},{-1,-1},{-1,-1}},        // 4
        {{3,2},{3,1},{-1,-1},{-1,-1},{-1,-1},{-1,-1},{-1,-1},{-1,-1}},        // 5
        {{4,2},{4,1},{-1,-1},{-1,-1},{-1,-1},{-1,-1},{-1,-1},{-1,-1}}         // 6
    }
};
```

An alternate lookup table for the VLC-NUM 2 case of 6 leading zeros is given below. The output of the VLC-NUM 2 LUT can result in a 2-bit codeword or any of 6 3-bit codewords. The 2-bit codeword matches an entry in the table above. The 3-bit codewords are handled here.

```
const struct__NumCoeffAndTROnes
    AltVLC2NumCoeffAndTROnes[8] = {
        {15,1},{14,0},{14,3},{14,2},{14,1},{13,0},{-1,-1},{-1,-1}
};
```

The prior art approach is slower. More specifically, one prior art approach for decoding these values is to perform pattern matching between the codes in the encoder's table (selected by N) and the bits at the head of the bitstream. This can be rather slow as there are up to 62 codes, with lengths up to 16 bits, for each N. Another less efficient prior art approach creates all-inclusive inverse lookup tables, sized to match the longest possible code. Such an approach is less efficient due to the resulting larger processor cache usage and corresponding larger number of cache misses. A full inverse lookup table would be 64K*3*4=768 K bytes (3 bytes for entry for run before, number of trailing ones, and code length), compared with the 1104 bytes used in one embodiment of the present invention.

Number of Total Zeros

In one embodiment, an encoder obtains the VLC for this value using a lookup table indexed by this value and the number of coefficients (NC, value 1 . . . 15). The number of possible values (and the length of the VLC's) decreases as the number of coefficients increases. For decoding, in one embodiment, the decoder uses a lookup table for NC=2 . . . 9 inclusive and unique code for each of the remaining cases. This blend of methods provides better performance tradeoff between lookup table size and code size/execution cycles. The lookup table is indexed by the next 6 bits from the bitstream—6 bits being the maximum VLC length for those cases, and returns number of total zeros and VLC code length packed into an 8-bit value (packing to reduce lookup table size).

Figure 3:
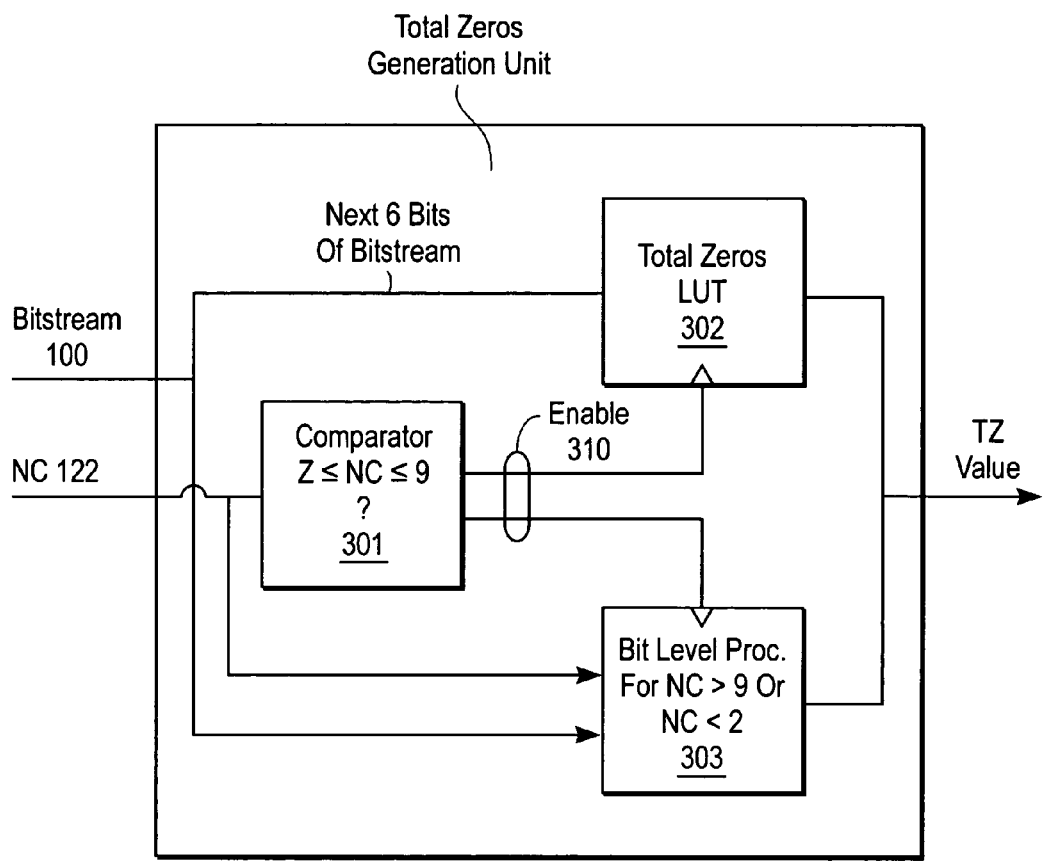
FIG. 3 is a flow diagram of one embodiment of a total zeros generation unit.

FIG. 3 is a flow diagram of one embodiment of a total zeros (TZ) generation unit that comprises comparison unit 301, TZ LUT 302, and bit level processing 303. Each of these blocks is implemented with processing logic that may comprise hardware (e.g., circuitry, dedicated logic, etc.), software (such as is run on a general purpose computer system or a dedicated machine), or a combination of both.

Referring to FIG. 3, comparison unit 301 receives NC value 122 and compares whether NC value 122 is greater or equal to 2 and less than or equal to 9. If it is, comparison unit 301 enables TZ LUT 302 and disables bit level processing 303 using enable output 310. If it is not, comparison unit 301 enables bit level processing 303 and disables TZ LUT 302 using enable output 310.

If TZ LUT 302 is enabled, TZ LUT 302 is indexed by the next 6 bits of bitstream 100 and, in response thereto, outputs a value indicative of the number of TZ and the VLC code length. An exemplary TZ LUT is given below. The number of TZ is the output of total zeros generation unit 111. The VLC code length is used to update the current point in bitstream 100 to the next VLC.

If bit level processing 303 is enabled (for cases when NC is greater than 9 or less than 2), bit level processing 303 generates a value indicative of the number of total zeros.

In one embodiment, bit level processing 303 generates its outputs using NC-specific code. Two examples of the NC-specific code used when the lookup table is not used follow. NC-specific code for the other values of NC (e.g., NC equals 10, 11, 12, 14 and 15) use similar techniques and would be apparent to one skilled in the art in view of the code given below.

```
LZ: Leading Zeros, ie number of zero bits at start of VLC
CL: Code Length in bits
TZ: Total zeros
NC=1
If LZ = 0
    TZ = 1, CL = 1
Else if LZ = 8
    TZ = 15, CL = 9
Else
    TZ = LZ*2 - (final bit of code), CL = LZ+2
NC=13
CL = LZ + 1
If LZ < 2
    TZ = LZ + 2
Else if LZ = 2
    TZ = 1
Else if LZ > 2
    TZ = 0, CL = 3
```

Total Zeros

The following is one embodiment of a TZ LUT, for Num-Coeff=2 . . . 15, which is indexed by the next 6 bits from the bitstream. This LUT returns a byte that contains total zeros in the low nibble and the bitstream code length in the upper nibble.

```
const U8 TZ__Lookup[14][64] = {
{
0x6e, 0x6d, 0x6c, 0x6b, 0x5a, 0x5a, 0x59, 0x59, 0x48, 0x48, 0x48, 0x48, 0x47, 0x47, 0x47, 0x47,
0x46, 0x46, 0x46, 0x46, 0x45, 0x45, 0x45, 0x45, 0x34, 0x34, 0x34, 0x34, 0x34, 0x34, 0x34, 0x34,
0x33, 0x33, 0x33, 0x33, 0x33, 0x33, 0x33, 0x33, 0x32, 0x32, 0x32, 0x32, 0x32, 0x32, 0x32, 0x32,
0x31, 0x31, 0x31, 0x31, 0x31, 0x31, 0x31, 0x31, 0x30, 0x30, 0x30, 0x30, 0x30, 0x30, 0x30, 0x30
},
{
0x6d, 0x6b, 0x5c, 0x5c, 0x5a, 0x5a, 0x59, 0x59, 0x48, 0x48, 0x48, 0x48, 0x45, 0x45, 0x45, 0x45,
0x44, 0x44, 0x44, 0x44, 0x40, 0x40, 0x40, 0x40, 0x37, 0x37, 0x37, 0x37, 0x37, 0x37, 0x37, 0x37,
0x36, 0x36, 0x36, 0x36, 0x36, 0x36, 0x36, 0x36, 0x33, 0x33, 0x33, 0x33, 0x33, 0x33, 0x33, 0x33,
0x32, 0x32, 0x32, 0x32, 0x32, 0x32, 0x32, 0x32, 0x31, 0x31, 0x31, 0x31, 0x31, 0x31, 0x31, 0x31
},
{
0x5c, 0x5c, 0x5b, 0x5b, 0x5a, 0x5a, 0x50, 0x50, 0x49, 0x49, 0x49, 0x49, 0x47, 0x47, 0x47, 0x47,
0x43, 0x43, 0x43, 0x43, 0x42, 0x42, 0x42, 0x42, 0x38, 0x38, 0x38, 0x38, 0x38, 0x38, 0x38, 0x38,
0x36, 0x36, 0x36, 0x36, 0x36, 0x36, 0x36, 0x36, 0x35, 0x35, 0x35, 0x35, 0x35, 0x35, 0x35, 0x35,
0x34, 0x34, 0x34, 0x34, 0x34, 0x34, 0x34, 0x34, 0x31, 0x31, 0x31, 0x31, 0x31, 0x31, 0x31, 0x31
},
```

-continued

```
{
0x5b, 0x5b, 0x59, 0x59, 0x4a, 0x4a, 0x4a, 0x4a, 0x48, 0x48, 0x48, 0x48, 0x42, 0x42, 0x42, 0x42,
0x41, 0x41, 0x41, 0x41, 0x40, 0x40, 0x40, 0x40, 0x37, 0x37, 0x37, 0x37, 0x37, 0x37, 0x37, 0x37,
0x36, 0x36, 0x36, 0x36, 0x36, 0x36, 0x36, 0x36, 0x35, 0x35, 0x35, 0x35, 0x35, 0x35, 0x35, 0x35,
0x34, 0x34, 0x34, 0x34, 0x34, 0x34, 0x34, 0x34, 0x33, 0x33, 0x33, 0x33, 0x33, 0x33, 0x33, 0x33
},
{
0x6a, 0x60, 0x51, 0x51, 0x48, 0x48, 0x48, 0x48, 0x39, 0x39, 0x39, 0x39, 0x39, 0x39, 0x39, 0x39,
0x37, 0x37, 0x37, 0x37, 0x37, 0x37, 0x37, 0x37, 0x36, 0x36, 0x36, 0x36, 0x36, 0x36, 0x36, 0x36,
0x35, 0x35, 0x35, 0x35, 0x35, 0x35, 0x35, 0x35, 0x34, 0x34, 0x34, 0x34, 0x34, 0x34, 0x34, 0x34,
0x33, 0x33, 0x33, 0x33, 0x33, 0x33, 0x33, 0x33, 0x32, 0x32, 0x32, 0x32, 0x32, 0x32, 0x32, 0x32
},
{
0x69, 0x60, 0x51, 0x51, 0x47, 0x47, 0x47, 0x47, 0x38, 0x38, 0x38, 0x38, 0x38, 0x38, 0x38, 0x38,
0x36, 0x36, 0x36, 0x36, 0x36, 0x36, 0x36, 0x36, 0x34, 0x34, 0x34, 0x34, 0x34, 0x34, 0x34, 0x34,
0x33, 0x33, 0x33, 0x33, 0x33, 0x33, 0x33, 0x33, 0x32, 0x32, 0x32, 0x32, 0x32, 0x32, 0x32, 0x32,
0x25, 0x25, 0x25, 0x25, 0x25, 0x25, 0x25, 0x25, 0x25, 0x25, 0x25, 0x25, 0x25, 0x25, 0x25, 0x25
},
{
0x68, 0x60, 0x52, 0x52, 0x41, 0x41, 0x41, 0x41, 0x37, 0x37, 0x37, 0x37, 0x37, 0x37, 0x37, 0x37,
0x36, 0x36, 0x36, 0x36, 0x36, 0x36, 0x36, 0x36, 0x33, 0x33, 0x33, 0x33, 0x33, 0x33, 0x33, 0x33,
0x25, 0x25, 0x25, 0x25, 0x25, 0x25, 0x25, 0x25, 0x25, 0x25, 0x25, 0x25, 0x25, 0x25, 0x25, 0x25,
0x24, 0x24, 0x24, 0x24, 0x24, 0x24, 0x24, 0x24, 0x24, 0x24, 0x24, 0x24, 0x24, 0x24, 0x24, 0x24
},
{
0x61, 0x60, 0x57, 0x57, 0x42, 0x42, 0x42, 0x42, 0x35, 0x35, 0x35, 0x35, 0x35, 0x35, 0x35, 0x35,
0x26, 0x26, 0x26, 0x26, 0x26, 0x26, 0x26, 0x26, 0x26, 0x26, 0x26, 0x26, 0x26, 0x26, 0x26, 0x26,
0x24, 0x24, 0x24, 0x24, 0x24, 0x24, 0x24, 0x24, 0x24, 0x24, 0x24, 0x24, 0x24, 0x24, 0x24, 0x24,
0x23, 0x23, 0x23, 0x23, 0x23, 0x23, 0x23, 0x23, 0x23, 0x23, 0x23, 0x23, 0x23, 0x23, 0x23, 0x23
},
{
0x51, 0x51, 0x50, 0x50, 0x46, 0x46, 0x46, 0x46, 0x32, 0x32, 0x32, 0x32, 0x32, 0x32, 0x32, 0x32,
0x25, 0x25, 0x25, 0x25, 0x25, 0x25, 0x25, 0x25, 0x25, 0x25, 0x25, 0x25, 0x25, 0x25, 0x25, 0x25,
0x24, 0x24, 0x24, 0x24, 0x24, 0x24, 0x24, 0x24, 0x24, 0x24, 0x24, 0x24, 0x24, 0x24, 0x24, 0x24,
0x23, 0x23, 0x23, 0x23, 0x23, 0x23, 0x23, 0x23, 0x23, 0x23, 0x23, 0x23, 0x23, 0x23, 0x23, 0x23
},
{
0x40, 0x40, 0x40, 0x40, 0x41, 0x41, 0x41, 0x41, 0x32, 0x32, 0x32, 0x32, 0x32, 0x32, 0x32, 0x32,
0x33, 0x33, 0x33, 0x33, 0x33, 0x33, 0x33, 0x33, 0x35, 0x35, 0x35, 0x35, 0x35, 0x35, 0x35, 0x35,
0x14, 0x14, 0x14, 0x14, 0x14, 0x14, 0x14, 0x14, 0x14, 0x14, 0x14, 0x14, 0x14, 0x14, 0x14, 0x14,
0x14, 0x14, 0x14, 0x14, 0x14, 0x14, 0x14, 0x14, 0x14, 0x14, 0x14, 0x14, 0x14, 0x14, 0x14, 0x14
},
{
0x40, 0x40, 0x40, 0x40, 0x41, 0x41, 0x41, 0x41, 0x34, 0x34, 0x34, 0x34, 0x34, 0x34, 0x34, 0x34,
0x22, 0x22, 0x22, 0x22, 0x22, 0x22, 0x22, 0x22, 0x22, 0x22, 0x22, 0x22, 0x22, 0x22, 0x22, 0x22,
0x13, 0x13, 0x13, 0x13, 0x13, 0x13, 0x13, 0x13, 0x13, 0x13, 0x13, 0x13, 0x13, 0x13, 0x13, 0x13,
0x13, 0x13, 0x13, 0x13, 0x13, 0x13, 0x13, 0x13, 0x13, 0x13, 0x13, 0x13, 0x13, 0x13, 0x13, 0x13
},
{
0x30, 0x30, 0x30, 0x30, 0x30, 0x30, 0x30, 0x30, 0x31, 0x31, 0x31, 0x31, 0x31, 0x31, 0x31, 0x31,
0x23, 0x23, 0x23, 0x23, 0x23, 0x23, 0x23, 0x23, 0x23, 0x23, 0x23, 0x23, 0x23, 0x23, 0x23, 0x23,
0x12, 0x12, 0x12, 0x12, 0x12, 0x12, 0x12, 0x12, 0x12, 0x12, 0x12, 0x12, 0x12, 0x12, 0x12, 0x12,
0x12, 0x12, 0x12, 0x12, 0x12, 0x12, 0x12, 0x12, 0x12, 0x12, 0x12, 0x12, 0x12, 0x12, 0x12, 0x12
},
{
0x20, 0x20, 0x20, 0x20, 0x20, 0x20, 0x20, 0x20, 0x20, 0x20, 0x20, 0x20, 0x20, 0x20, 0x20, 0x20,
0x21, 0x21, 0x21, 0x21, 0x21, 0x21, 0x21, 0x21, 0x21, 0x21, 0x21, 0x21, 0x21, 0x21, 0x21, 0x21,
0x12, 0x12, 0x12, 0x12, 0x12, 0x12, 0x12, 0x12, 0x12, 0x12, 0x12, 0x12, 0x12, 0x12, 0x12, 0x12,
0x12, 0x12, 0x12, 0x12, 0x12, 0x12, 0x12, 0x12, 0x12, 0x12, 0x12, 0x12, 0x12, 0x12, 0x12, 0x12
},
{
0x10, 0x10, 0x10, 0x10, 0x10, 0x10, 0x10, 0x10, 0x10, 0x10, 0x10, 0x10, 0x10, 0x10, 0x10, 0x10,
0x10, 0x10, 0x10, 0x10, 0x10, 0x10, 0x10, 0x10, 0x10, 0x10, 0x10, 0x10, 0x10, 0x10, 0x10, 0x10,
0x11, 0x11, 0x11, 0x11, 0x11, 0x11, 0x11, 0x11, 0x11, 0x11, 0x11, 0x11, 0x11, 0x11, 0x11, 0x11,
0x11, 0x11, 0x11, 0x11, 0x11, 0x11, 0x11, 0x11, 0x11, 0x11, 0x11, 0x11, 0x11, 0x11, 0x11, 0x11
}
};   // TZ_Lookup
```

Again, one much slower alternative prior art approach for decoding this number of zeros value is to perform pattern matching between the codes in the encoder's table (part selected by NC) and the bits at the head of the bitstream. This can be rather slow as there are up to 16 codes of length up to 9 bits in the table. The other currently used method of a full inverse lookup table requires 15*512*2 bytes, or 15360 bytes, compared to the 896 byte table used by one embodiment of the present invention.

Run Before Values

In one embodiment, an encoder obtains the VLC for these values using a lookup table indexed by this value and a Zeros-Left value (ZL, possible values 1 . . . 15) calculated while calculating the 4×4 block position of the coefficients. The number of possible values (and the length of the VLC's) decreases as ZL decreases. For decoding, the decoder uses a lookup table for ZL<7 and bit parsing code for the case when ZL>6. In one embodiment, the lookup table is indexed by the next 3 bits from the bitstream, with 3 bits being the maximum VLC length for those cases, and returns run before value and VLC code length packed into an 8-bit value (packing to reduce lookup table size).

Figure 4:
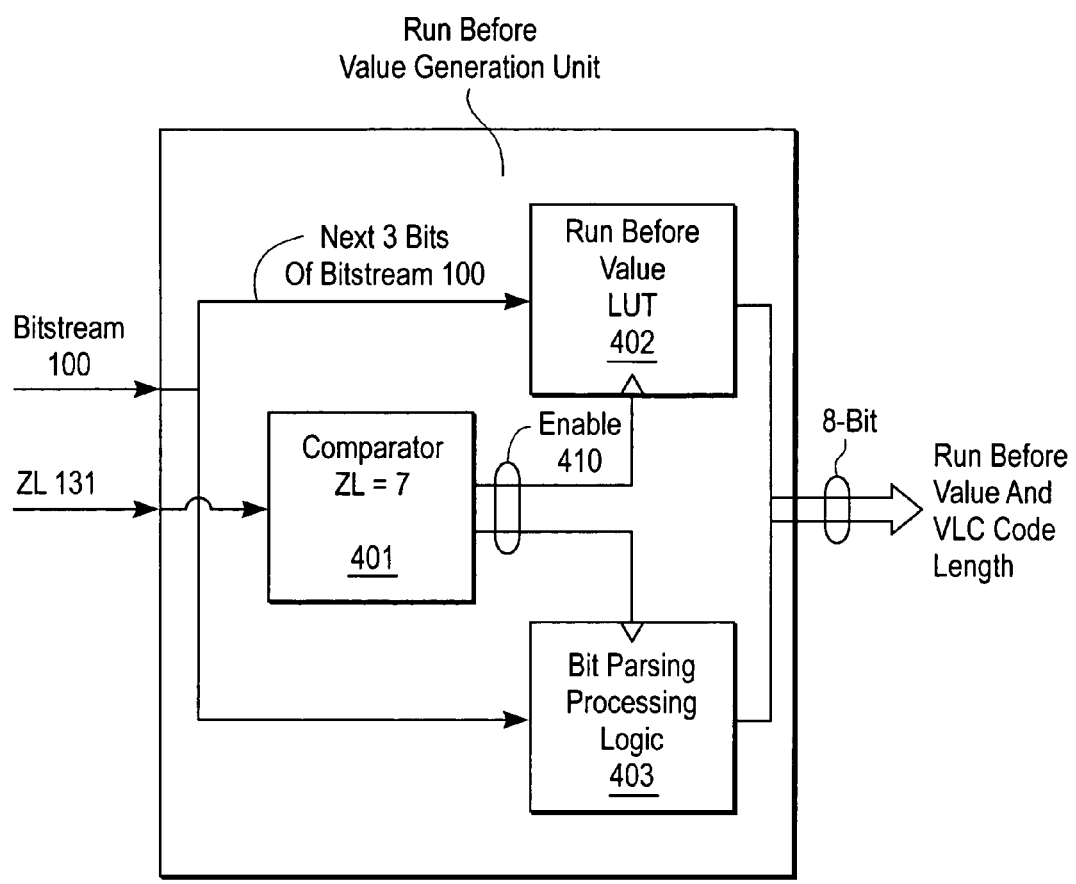
FIG. 4 is a flow diagram of one embodiment of a runs before value generation unit.

FIG. 4 is a flow diagram of one embodiment of a run before (RB) value generation unit that comprises comparison unit 401, RB LUT 402, and bit parsing processing 403. Each of these blocks is implemented with processing logic that may comprise hardware (e.g., circuitry, dedicated logic, etc.), software (such as is run on a general purpose computer system or a dedicated machine), or a combination of both.

Referring to FIG. 4, comparison unit 401 receives ZL value 131 and compares whether ZL value 131 is greater than 6. If it is not, comparison unit 401 enables RB LUT 402 and disables bit parsing processing 403 using enable output 410. If it is, comparison unit 401 enables bit parsing processing 403 and disables RB LUT 402 using enable output 410.

If RB LUT 402 is enabled, RB LUT 402 is indexed by the next 3 bits of bitstream 100 and, in response thereto, outputs a value indicative of the RB value and the VLC code length. An exemplary RB LUT is given below. In one embodiment, the value indicative of the RB value and the VLC code length are output as an 8-bit value. The RB value is the output of the run before generation unit 112. The VLC code length is used to update the current point in bitstream 100 to the next VLC.

If bit parsing processing 403 is enabled (for cases when ZL value 131 is greater than 6), bit parsing processing 403 generates a RB value.

Exemplary pseudo-code for the ZL>6 case is as follows:

```
LZ: Leading Zeros, ie number of zero bits at start of VLC
CL: Code Length in bits
RB: Run Before
If LZ > 2
    RB = LZ + 4
    CL = LZ + 1
Else
    RB = 7 - (3 leading bitstream bits)
    CL = 3
```

An alternative approach of pattern matching is not too bad when ZL<7, as the maximum number of codes is 7, with lengths up to 3 bits, but ends up being much slower because there can be multiple Run Before values to read for each 4×4 block, thus multiplying the inefficiency cost. Using a full inverse lookup table instead would require 7*2048*2 bytes (28672), compared to the 48-byte table used by one embodiment of the present invention.

Run Before

Below is one embodiment of a run before lookup table, for ZerosLeft=1.6, which is indexed by the next 3 bits from the bitstream. This LUT returns a byte that contains Run Before value in the low nibble and the bitstream code length in the upper nibble.

```
const U8 RB_Lookup[6][8] = {
{
0x11, 0x11, 0x11, 0x11, 0x10, 0x10, 0x10, 0x10,
},
{
0x22, 0x22, 0x21, 0x21, 0x10, 0x10, 0x10, 0x10,
},
{
0x23, 0x23, 0x22, 0x22, 0x21, 0x21, 0x20, 0x20,
},
{
0x34, 0x33, 0x22, 0x22, 0x21, 0x21, 0x20, 0x20,
},
{
0x35, 0x34, 0x33, 0x32, 0x21, 0x21, 0x20, 0x20,
},
{
0x31, 0x32, 0x34, 0x33, 0x36, 0x35, 0x20, 0x20,
},
};  // RB_Lookup
```

Decode All CAVLC Codes for 4×4 Block at Once

The bitstream ordering of the CAVLC codes enables a decoding implementation that initially obtains the number of coefficients, the number of trailing ones, and the coefficients, and then processes this information to place the coefficients and trailing ones into the appropriate 4×4 block positions, obtaining Total Zero and Run Before values from the bitstream as they are needed to determine block position. In one decoder embodiment, all of the CAVLC codes (including Total Zeros and Run Before values) for the 4×4 block are parsed at once, buffering the decoded values. This is more efficient because the overhead associated with reading bitstream data, which includes loading a pointer, reading the next few bytes, shifting to the current bit offset, checking for and possibly correcting for start code emulation prevention bytes, is incurred only once for each 4×4 block.

Embodiments of the present invention may be used for H.264 video decoding. Using the lookup tables described herein, the H.264 video decoding may be performed with faster results than the prior art.

For portable video applications (for which memory footprint is even more important), the total lookup table size of one embodiment of the present invention is 2048 bytes, which is much smaller than the ~800 Kbytes for a full inverse lookup solution.

An Exemplary Computer System

Figure 5:
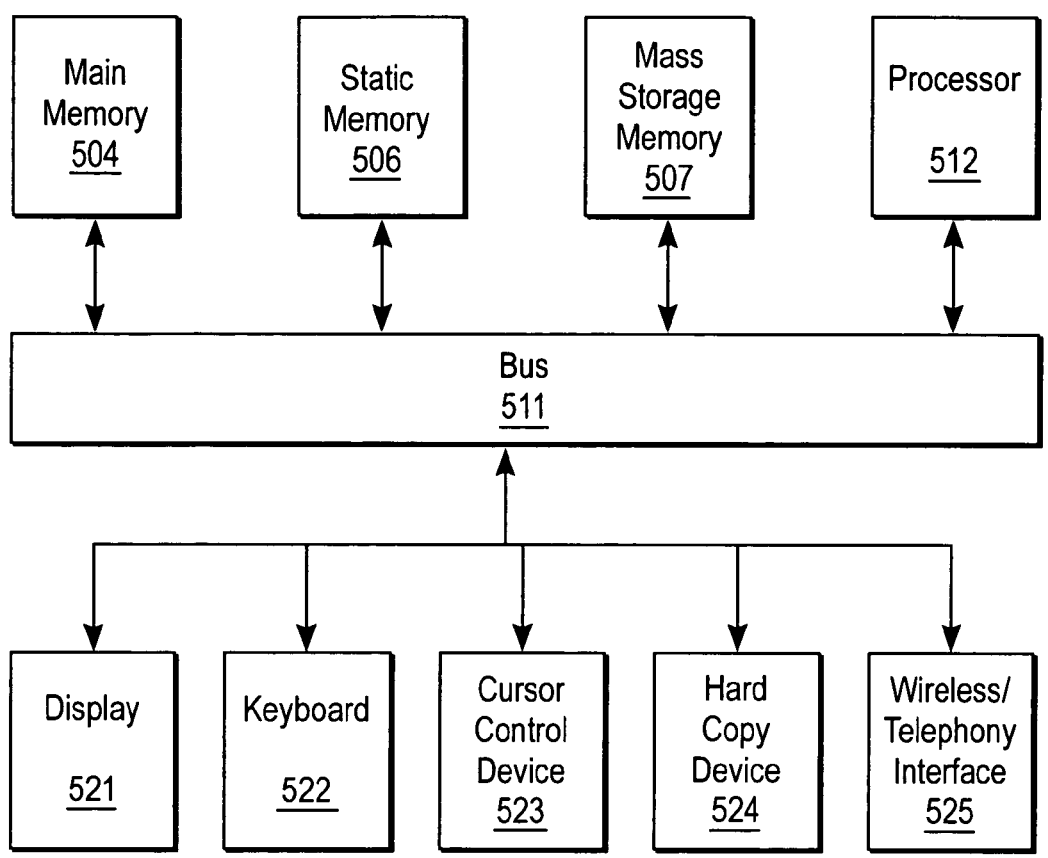
FIG. 5 is a block diagram of one embodiment of a computer system.

FIG. 5 is a block diagram of an exemplary computer system that may perform one or more of the operations described herein. Referring to FIG. 5, computer system 500 may comprise an exemplary client or a server computer system. Computer system 500 comprises a communication mechanism or bus 511 for communicating information, and a processor 512 coupled with bus 511 for processing information. Processor 512 includes a microprocessor, but is not limited to a microprocessor, such as, for example, Pentium™, PowerPC™, Alpha™, etc.

System 500 further comprises a random access memory (RAM), or other dynamic storage device 504 (referred to as main memory) coupled to bus 511 for storing information and instructions to be executed by processor 512. Main memory 504 also may be used for storing temporary variables or other intermediate information during execution of instructions by processor 512.

Computer system 1500 also comprises a read only memory (ROM) and/or other static storage device 506 coupled to bus 511 for storing static information and instructions for processor 512, and a data storage device 507, such as a magnetic disk or optical disk and its corresponding disk drive. Data storage device 507 is coupled to bus 511 for storing information and instructions.

Computer system 500 may further be coupled to a display device 521, such as a cathode ray tube (CRT) or liquid crystal display (LCD), coupled to bus 511 for displaying information to a computer user. An alphanumeric input device 522, including alphanumeric and other keys, may also be coupled to bus 511 for communicating information and command selections to processor 512. An additional user input device is cursor control 523, such as a mouse, trackball, trackpad, stylus, or cursor direction keys, coupled to bus 511 for communicating direction information and command selections to processor 512, and for controlling cursor movement on display 521.

Another device that may be coupled to bus 511 is hard copy device 524, which may be used for printing instructions, data, or other information on a medium such as paper, film, or similar types of media. Furthermore, a sound recording and playback device, such as a speaker and/or microphone may optionally be coupled to bus 511 for audio interfacing with computer system 500. Another device that may be coupled to bus 511 is a wired/wireless communication capability 525 to communication to a phone or handheld palm device.

Note that any or all of the components of system 500 and associated hardware may be used in the present invention. However, it can be appreciated that other configurations of the computer system may include some or all of the devices.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

I claim:

1. A method for decoding a bitstream comprising:
   using a variable length coding (VLC) decoder to perform operations of
   generating an indication of a number of coefficients and a number of trailing ones in a portion of a bitstream using either:
      a first lookup table (LUT) indexed by a number of leading zeros to return a number that indicates a number of remaining bits in a code to be read from the bitstream and a second LUT indexed by both the number of leading zeros and the remaining code bits to return the number of coefficients and the number of trailing ones; or
      bit level parsing when the leading zeros value equals a predetermined value;
   generating an indication of a number of total zeros, including using either a third LUT indexed by the number of coefficients and bits of the bitstream when the number of coefficients is in a first range or bit level parsing when the number of coefficients is outside the first range;
   generating an indication of one or more run before values using either a fourth LUT indexed by the number of coefficients and bits of the bitstream when a zeros left value is in a second range or bit level parsing when the zeros left is not in the second range; and
   generating coefficients in block positions in response to the generation of the trailing ones value, the number of coefficients value, the total zeros value and run before values.

2. The method defined in claim 1 wherein the predetermined value is zero.

3. The method defined in claim 1 further comprising selecting either the bit level parsing or the first LUT, wherein the bit level parsing comprises bit parsing code fragments.

4. The method defined in claim 1 further comprising using another LUT indexed by the number of coefficients value output from the second LUT when the number of coefficients value output from the second LUT is a predefined value.

5. The method defined in claim 4 wherein the predefined value is greater than the number of possible coefficients in a block.

6. The method defined in claim 1 wherein the first range is when the number of coefficients is greater than or equal to 2 and less than or equal to 9.

7. The method defined in claim 1 wherein the bit level parsing to generate the total zeros indication comprises code.

8. The method defined in claim 1 wherein the second range is when the zeros left value is greater than 6.

9. An article of manufacture comprising:
   a machine-accessible storage medium storing instructions thereon that, when accessed by the machine, cause the machine to perform operations comprising
   generating an indication of a number of coefficients and a number of trailing ones in a portion of a bitstream using either:
      a first lookup table (LUT) indexed by a number of leading zeros to return a number that indicates a number of remaining bits in a code to be read from the bitstream and a second LUT indexed by both the number of leading zeros and the remaining code bits to return the number of coefficients and the number of trailing ones; or
      bit level parsing when the leading zeros value equals a predetermined value;
   generating an indication of a number of total zeros, including using either a third LUT indexed by the number of coefficients and bits of the bitstream when the number of coefficients is in a first range or bit level parsing when the number of coefficients is outside the first range;
   generating an indication of one or more run before values using either a second LUT indexed by the number of coefficients and bits of the bitstream when a zeros left value is in a second range or bit level parsing when the zeros left is not in the second range;
   generating coefficients in block positions in response to the generation of the trailing ones value, the number of coefficients value, the total zeros value and the one or more run before values.

10. The article of manufacture defined in claim 9 wherein the predetermined value is zero.

11. The article of manufacture defined in claim 9 wherein the bit level parsing comprises bit parsing code fragments.

12. The article of manufacture of claim 9, wherein the machine-accessible medium further includes data that cause the machine to perform operations comprising:
   using another LUT when the number of coefficients value output from the second LUT is a predefined value.

13. The article of manufacture defined in claim 12 wherein the predefined value is greater than the number of possible coefficients in a block.

14. The article of manufacture defined in claim 9 wherein the first range is when the number of coefficients is greater than or equal to 2 and less than or equal to 9.

15. The article of manufacture defined in claim 9 wherein the bit level parsing to generate total zeros indication comprises code.

16. The article of manufacture defined in claim 9 wherein the second range is when the zeros left value is greater than 6.

17. An apparatus for decoding a bitstream comprising:
   means for generating an indication of a number of coefficients and a number of trailing ones in a portion of a bitstream using either:

a first lookup table (LUT) indexed by a number of leading zeros to return a number that indicates a number of remaining bits in a code to be read from the bitstream and a second LUT indexed by both the number of leading zeros and the remaining code bits to return the number of coefficients and the number of trailing ones; or bit level parsing when the leading zeros value equals a predetermined value;

means for generating an indication of a number of total zeros, including using either a third LUT indexed by the number of coefficients and bits of the bitstream when the number of coefficients is in a first range or bit level parsing when the number of coefficients is outside the first range;

means for generating an indication of one or more run before values using either a fourth LUT indexed by the number of coefficients and bits of the bitstream when a zeros left value is in a second range or bit level parsing when the zeros left is not in the second range;

means for generating coefficients in block positions in response to the generation of the trailing ones value, the number of coefficients value, the total zeros value and run before values.

18. The apparatus defined in claim 17 wherein the bit level parsing comprises bit parsing code fragments, wherein the means for generating the indication of the number of coefficients is operable to select either the bit level parsing or the first LUT.

19. The apparatus of claim 17 wherein another LUT is used when the number of coefficients value output from the second LUT is a predefined value.

20. An apparatus for decoding a bitstream comprising:

a number of coefficient and trailing zeros generation unit, having first and second lookup tables (LUTs) and bit level parsing, to generate an indication of a number of coefficients and a number of trailing ones in a portion of a bitstream using either:

the first LUT indexed by a number of leading zeros to return a number that indicates a number of remaining bits in a code to be read from the bitstream and the second LUT indexed by both the number of leading zeros and the remaining code bits to return the number of coefficients and the number of trailing ones; or bit level parsing when the leading zeros value equals a predetermined value;

a total zeros generation unit, having a third LUT and bit level parsing, to generate an indication of a number of total zeros, including using either the third LUT indexed by the number of coefficients and bits of the bitstream when the number of coefficients is in a first range or bit level parsing when the number of coefficients is outside the first range;

a run before values generation unit, having a fourth LUT and bit level parsing, to generate an indication of one or more run before values using either the fourth LUT indexed by the number of coefficients and bits of the bitstream when a zeros left value is in a second range or bit level parsing when the zeros left is not in the second range;

a coefficient generator unit to generate coefficients in block positions in response to the generation of the trailing ones value, the number of coefficients value, the total zeros value and run before values.

21. The apparatus defined in claim 20 wherein the bit level parsing comprises bit parsing code fragments, and further comprising a selection to choose either the bit parsing or the first LUT.

22. The apparatus defined in claim 20 further comprising using another LUT when the number of coefficients value output from the second LUT is a predefined value.

* * * * *